United States Patent [19]
Ghanayem

[11] Patent Number: 5,552,016
[45] Date of Patent: Sep. 3, 1996

[54] METHOD AND APPARATUS FOR ETCHBACK ENDPOINT DETECTION

[75] Inventor: Steve G. Ghanayem, Sunnyvale, Calif.

[73] Assignee: Applied Materials, Inc., Santa Clara, Calif.

[21] Appl. No.: 516,115

[22] Filed: Aug. 17, 1995

Related U.S. Application Data

[63] Continuation of Ser. No. 364,030, Dec. 23, 1994, abandoned, which is a continuation of Ser. No. 141,171, Oct. 22, 1993, abandoned, which is a continuation-in-part of Ser. No. 55,066, Apr. 28, 1993, abandoned.

[51] Int. Cl.$^6$ ............................ H01L 21/306; C23F 1/02
[52] U.S. Cl. ......................................... 156/627.1; 156/345
[58] Field of Search ............................ 156/345, 626.1, 156/627.1, 643.1; 216/60

[56] References Cited

U.S. PATENT DOCUMENTS

| | | | |
|---|---|---|---|
| 4,246,060 | 1/1981 | Keller | 156/345 |
| 4,263,089 | 4/1981 | Keller | 156/627.1 |
| 4,312,732 | 1/1982 | Degenkold et al. | 204/192 |
| 4,328,068 | 5/1982 | Curtis | 216/60 |
| 4,491,499 | 1/1985 | Jerde et al. | 156/626 |
| 4,615,761 | 10/1986 | Tada et al. | 156/626 |
| 5,014,217 | 5/1991 | Savage | 364/498 |
| 5,045,149 | 9/1991 | Nulty | 156/627 |
| 5,160,402 | 11/1992 | Cheng | 156/627 |
| 5,242,532 | 9/1993 | Cain | 156/626 |
| 5,308,414 | 5/1994 | O'Neill et al. | 216/60 |
| 5,450,205 | 9/1995 | Sawin et al. | 356/382 |

FOREIGN PATENT DOCUMENTS

| | | | |
|---|---|---|---|
| 458324 | 11/1991 | European Pat. Off. | H01J 37/32 |
| 63178527 | 1/1987 | Japan | H01J 21/302 |

OTHER PUBLICATIONS

PCT Search Report for PCT/US94/04652 dated Jul. 29, 1994.
"Application of Optical Emission Spectroscopy to Semiconductor Processing", Spectroscopy, vol. 2 (No. 8), pp. 40–42, (1987).

Primary Examiner—R. Bruce Breneman
Assistant Examiner—Joni Y. Chang
Attorney, Agent, or Firm—Birgit E. Morris; Michael B. Einschlag

[57] ABSTRACT

A method and apparatus (110) for determining the endpoint (e.g., TC1) of an etching step in a plasma etching process (101) for use in semiconductor wafer manufacturing. In one embodiment, an optical bandpass filter (e.g., 1542) is used for detecting a wavelength of electromagnetic emissions from elements of a chlorine-argon plasma employed to etch a titanium nitride layer from a semiconductor wafer so as to achieve a more precise determination of the endpoint of the process step. In another embodiment, a plurality of wavelengths (e.g., 1541–1544) in the electromagnetic emissions from elements in the plasma are combined for even more precise determination of the endpoint of a process step. The emissions of interest may be from the same or different elements in the plasma which may be produced by the etching materials or by materials from the wafer being etched.

4 Claims, 11 Drawing Sheets

METHOD AND APPARATUS FOR ETCHBACK ENDPOINT DETECTION

RELATED APPLICATION

This is a continuation of U.S. application Ser. No. 08/364,030 filed Dec. 23, 1994, which is a continuation of U.S. Ser. No. 08/141,171 filed Oct. 22, 1993 which is a continuation-in-part of U.S. application Ser. No. 08/055,066 filed Apr. 28, 1993 all abandoned.

BACKGROUND OF THE DISCLOSURE

1. Field of the Invention

This present invention relates generally to methods and apparatus for processing semiconductor wafers using plasma etch techniques. In particular, this invention relates to a system and a concomitant methodology for optical emission detection to determine the optimum endpoint of a process step such as when the etching of a film on a wafer is complete.

2. Description of the Prior Art

Plasma processing is an established part of semiconductor wafer manufacturing processes that require etching. In the semiconductor industry, plasma etching is used for removing layers from a semiconductor wafer or for etching patterns in a layer of material overlaying a semiconductor wafer. Plasma processing is used to etch precise patterns in layers of polycrystalline silicon, silicon nitride, silicon dioxide, and the like, using a patterned photoresist layer as an etch mask. Plasma processing is also used for stripping photoresist layers, descumming wafers, or other cleaning steps.

It is desirable to have a highly controlled plasma etch process, as well as an automatically controlled process. To ensure that the desired etching and deposition occurs, it is important to closely control the plasma environment throughout the entire fabrication process. The plasma pressure, the ion concentration level and the relative volume(s) of the reactant gases have been used, usually in combination, to control the plasma environment. Other parameters and physical elements such as RF power, gas mixtures and flows, reactor chamber pressure, and substrate temperature and wafer loading factors also have been used to control plasma etching processes. The interaction of these parameters with respect to the plasma gas phase chemistry is extremely complex, thus making process repeatability difficult and process optimization poor. Other control techniques have been proposed and utilized in the past, including, for example, merely setting the time for the total reaction; detecting the completion of the reaction using a photodetector; detecting the onset of etching and then allowing the reaction to continue for a set length of time. While all of these techniques provide a degree of control, they are inadequate for precise process control and for the detection of the endpoint of a process step.

Optical emission spectroscopy is now utilized more commonly to control the plasma by identifying and monitoring chemical species in the plasma. In current spectroscopy plasma monitoring systems, a series of real time spectra displays are generated, each of which serves as a snapshot of the chemical constituents of the plasma at the time the spectrum was taken. Each spectrum display takes the form of a graph which plots the intensity of light emitted within the chamber versus wavelength over a designated frequency range. The displays are typically characterized by a multiplicity of spaced apart intensity peaks, with each significant intensity peak corresponding to the presence of a specific chemical species within the plasma. Accordingly, each chemical species having a significant volume within the plasma will appear as an intensity peak at the specific wavelength emitted by that species. Once the intensity peaks are identified from a library of waveform peaks associated with a specific chemical species that are expected in a given plasma process step, the volume or mass of each identified species can be ascertained from the magnitude of the intensity peak.

During etching, the different materials and elements in the plasma emit different wavelengths of light. As etching progresses, the composition of the plasma will change as the ratio of the different elements comprising the plasma changes. An endpoint detector detects these changes as variations in the intensity of the emissions being monitored and produces a signal representing these changes. The etch process is controlled by programming the detector to detect endpoint and to end the etch step when the signal fulfills preset parameters determined by the user.

For example, fluorine radicals are the main etch species used for etching tungsten. Fluorine radicals emit light with a wavelength of 704 nanometers (nm). A detector, mounted at the plasma chamber viewport, produces signals representing emissions from the various elements present in the plasma using selectable bandpass filters. While tungsten is being etched, there is little fluorine present in the plasma since it is being consumed. Therefore, the signal representing the fluorine emission is weak. When the majority of the tungsten is etched away and the adhesion layer is exposed, the fluorine signal intensity increases dramatically since more fluorine becomes present in the plasma. Eventually, the intensity of the emissions and corresponding signal produced by the detector will level off, indicating that the tungsten has been almost completely etched away and fluorine is no longer being consumed. When this point is reached, the process step is terminated.

Thus, by detecting changes in the magnitude of the intensity peaks of selected chemical species, the completion or endpoint of the wafer fabrication process steps in a plasma may be determined. Representative of prior art in automatic control of plasma etching systems is U.S. Pat. No. 4,491,499 issued to Jerde et al (Jerde). Jerde discloses a method for determining the time at which a plasma etching operation should be terminated. The method comprises three essential steps: (1) monitoring the optical emission intensity of the plasma in a narrow band centered about a predetermined spectral line indicative of the gas phase concentration of a plasma etch reactant or product; (2) monitoring the optical emission of the plasma in a wide band centered about the spectral line indicative of the optical background emission signal; and (3) generating a remainder intensity formed as the linear combination of the spectral line intensity and the background emission signal. The etching process is terminated whenever the remainder intensity and/or its time derivative achieves a predetermined value. The teachings and suggestions of this invention merely utilize the well-known principle of essentially subtracting from a weak, information-bearing signal a measure of the wide-band noise signal corrupting the weak signal to, in effect, cancel the noise masking the weak signal. The decision to terminate the etch step still relies on only one spectral line signal which is the same one conventionally relied upon to make the etch step termination decision.

In addition, U.S. Pat. No. 4,312,732, for example, discloses a system for detecting endpoint on the basis of the intensity of the light emitted by the glow discharge. When the intensity, as represented by a variable voltage, reaches some predetermined level, the process is terminated. U.S. Pat. No. 4,246,060 discloses a system for detecting a temporary uniformity of the voltage as indicative of optimal endpoint. See also Savage, Richard N., "Applications of Optical Emission Spectroscopy to Semiconductor Processing," Spectroscopy, Vol. 2 (No. 8), pp. 40–42, (1987) and associated U.S. Pat. No. 5,014,217.

The higher the amplitude of the signal representing the element of interest in the plasma, the better for detecting, and for detecting changes in, the presence of that element during a process step. The amplitudes of such signals vary substantially from element to element. For example, in the past, a 380 nm bandpass filter has been used when etching titanium nitride (TiN) to detect the nitrogen emission as the presence of this element changes in the plasma. However, the typical signal obtained from etching TiN is weak resulting in unreliable control of such etching steps. Accordingly, there is a need for improving endpoint detection in plasma etch systems.

SUMMARY OF THE INVENTION

In accordance with one aspect of my invention, to obtain greater signal strength for more reliable monitoring and control during etching of a semiconductor wafer (e.g., tungsten on TiN), the detector of the present invention uses a wavelength filter (e.g., 700 nm) different than conventionally taught in the prior art (e.g., 380 nm) to detect changes in the plasma during etchback for use in determining the endpoint of a particular step. Thus, improved endpoint detection results from monitoring changes in emissions from elements present in the plasma at a different wavelength than expected from the teachings of the prior art.

In yet another aspect of my invention, a plurality of signals detected using bandpass filters (e.g., the signals derived from both a 380 nm filter and the 700 nm filter) are combined with the resultant signal providing even greater signal strength and precision of control than just a single detected signal. Thus, improved endpoint detection also results from monitoring changes in emissions from elements present in the plasma at more than one wavelength for the same process step. The emissions, that is, optical wavelengths, of interest may be from the same or different elements in the plasma and may be produced by the etching materials or by materials from the wafer being etched. Also, it is preferred that the filters have a limited bandpass, e.g. ±20 nm, rather than a narrow bandpass of merely several nanometers, as is more typical with prior art. This further enhances signal strength and includes within the range of the filters several peaks useful in detecting both nitrogen and fluorine.

The etchback endpoint detection system of the present invention allows for automatic detection of etch endpoint and automatic termination of the etch process according to parameters set by the user. The system of the present invention is implemented in a physical embodiment comprising: (1) a detector, mounted to an etch chamber viewport, which is composed of a plurality of bandpass filters, each centered at an optical wavelength, for detecting and for convening the optical signals into electrical analog signals, and (2) a signal processor for receiving and processing the analog signals to generate an endpoint indicator which is transmitted to the plasma etching system to effect termination of the given etch step.

The endpoint detection system is coupled to the etching system by listing in the etching "recipe" a command which effects activation of the endpoint detection system. For instance, a given recipe is written with a "fictitious" process gas along with the actual etch process gasses at the point in the recipe requiring initialization of endpoint detection. When this point is reached in the recipe, a command corresponding to the fictitious gas is transmitted to the endpoint detection system to activate tracking of the emission signals at the appropriate time during the etchback process. When the endpoint detection system detects an endpoint indicator, the detection system returns an indicator signal to the plasma etching system which is then used to terminate the given etch step.

DETAILED DESCRIPTION

To facilitate understanding of the broadest aspects of the present invention, and especially the principles underlying the present invention, it is instructive to first elucidate these principles in an overview manner. This approach has the added advantage of introducing terminology and notation which will further aid in understanding the details of my invention. Accordingly, the initial part of the Detailed Description provides an overview of the system and methodology for controlling an etching step. After this overview, the details of an illustrative embodiment are presented.

OVERVIEW

This overview proceeds with a motivating discussion of endpoint processing in a plasma etching system; the discussion gradually becomes more detailed as the description unfolds so as to introduce concepts and principles in the most understandable manner.

Figure 1:
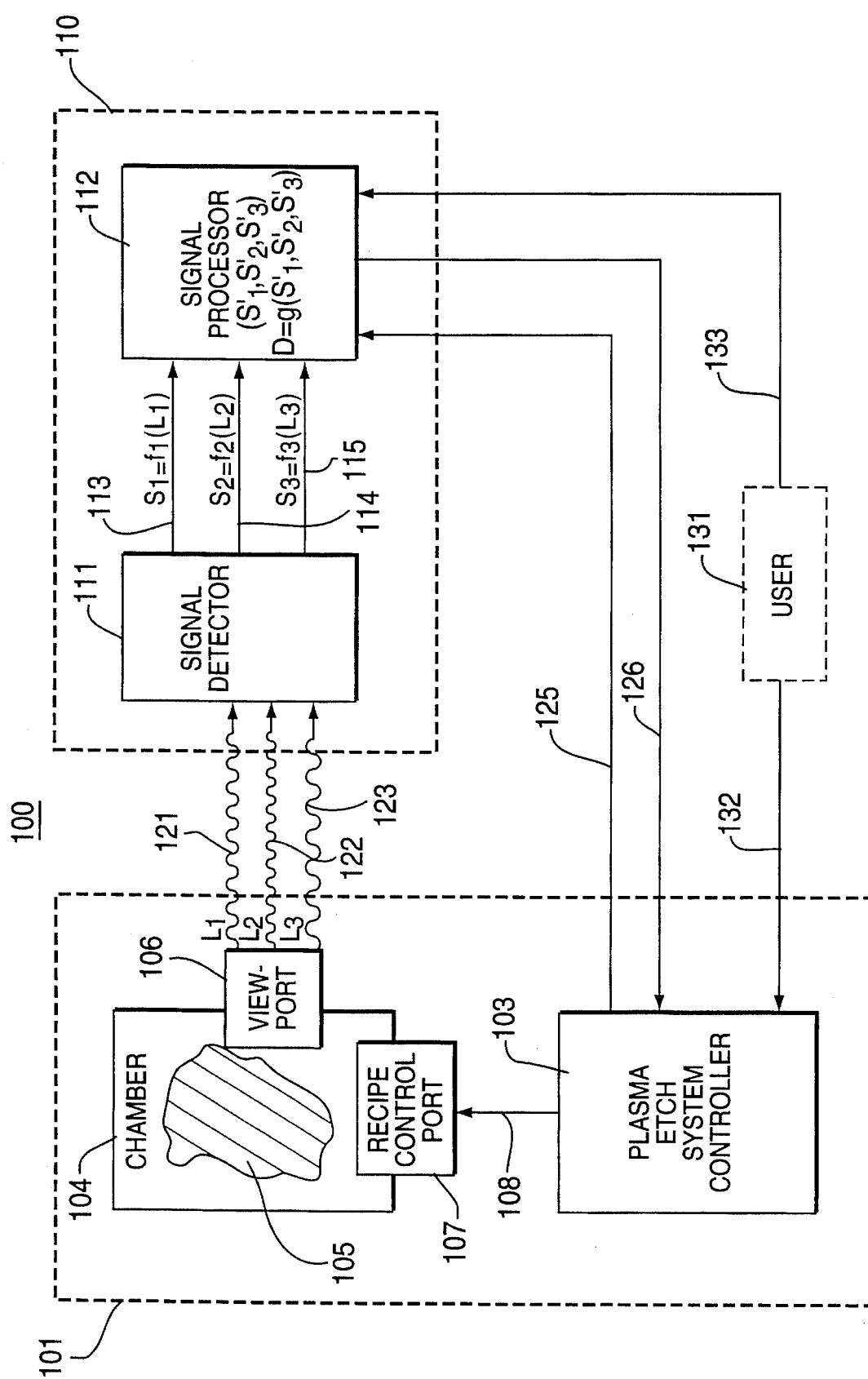
FIG. 1 is a block diagram of an arrangement for determining the endpoint of an etching step in a plasma etching system constructed according to the principles of the present invention.

Broadly, with reference to FIG. 1, there is shown an automated plasma etching arrangement 100 which includes an endpoint detector system 110. The endpoint detection system 110 generally comprises a serial arrangement of a signal detector 111 and a signal processor 112. The detector 111 receives a plurality of input signals 121–123 from the conventional plasma etching system 101 and, in turn, the signal detector 111 provides a plurality of input signals 113–115 to the signal processor 112.

To elaborate on the functionality of the detector 111 and the signal processor 112, it is necessary to first describe the origin and characteristics of the signals 121–123 and the signals 113–115 serving as inputs to the detector 111 and the signal processor 112, respectively; accordingly, attention is initially focused on the operation of the conventional plasma etching system 101 which produces the signals 121–123.

The system 101 is composed of a plasma chamber 104 and a plasma etch system controller 103. The plasma controller 103 receives its input from a system user 131 via a control bus 132. The user 131, typically a person in charge of the wafer fabrication process, supplies the controller 103 with a so-called "recipe" for the etch process; a recipe is a set of instructions for running a plasma, e.g. the pressure, power, gas types and flows, and so forth which are to be used during the plasma etching process. A recipe may be made up of several etch steps. The plasma, shown by the reference numeral 105, is produced within the plasma chamber 104. A recipe control port 107, responsive to the controller 103, controls the parameters of the chamber 104 (e.g., pressure) and the materials (e.g. fluorine gas) introduced into the chamber 104. During the plasma etching process, electromagnetic waves at the wavelengths of visible light are emitted; these various wavelengths are depicted by the reference indicia L1, L2, and L3 and are assigned the reference numerals 121–123, respectively. The visible light is "viewed" through a viewport 106 (e.g. a quartz window) of the chamber 104. For specificity but without loss of generality only three wavelengths are represented in FIG. 1.

The detector 111 is coupled to the viewport 106 for sensing the time variations of the various optical wavelengths emitted from the plasma 105 as it undergoes gas phase changes in the plasma chamber 104 during the etch process. For the immediate discussion, the functionality of the detector 111 may be broadly described as one of converting the optical wavelengths L1, L2, and L3 to the limited-band analog signals S1, S2, and S3, respectively, each analog signal being a function of a corresponding wavelength (for example, S1=f1(L1)). Typically the relation between L1 and S1 (as well as L2, S2 and L3, S3) is linear, with S1 representing the intensity of light having wavelength L1 detected through the viewport 106.

The signal processor 112 receives the analog signals S1, S2, and S3 as inputs via the signal leads 113–115, respectively. The signal processor 112 is programmed by the user 131, via a bus 133, with the procedure for processing the signals S1, S2, S3; for instance, for a given etch step, a linear combination of two analog signals may be selected for processing. The processor 112 is also responsive to the controller 103 so that the processing by the processor 112 may be synchronized with the plasma etch process, as discussed below. As depicted, the processor 112 processes the signals S1, S2, and S3 to obtain related signals S1', S2', and S3', respectively; moreover, the processor 112 produces a decision signal, referred to as D, related to S1', S2', and S3'. The relationship of the S1', S2' and S3' signals to and the characteristics of the signal D will be discussed momentarily. Processing of the D signal yields information to determine the endpoint condition for the etch step; such an endpoint condition triggers the termination of the given etch step—this is accomplished by sending a termination signal over a lead 126 to the controller 103, whereupon the controller 103 responds by terminating the particular etch step being monitored by the endpoint detection system 110.

Figure 2:
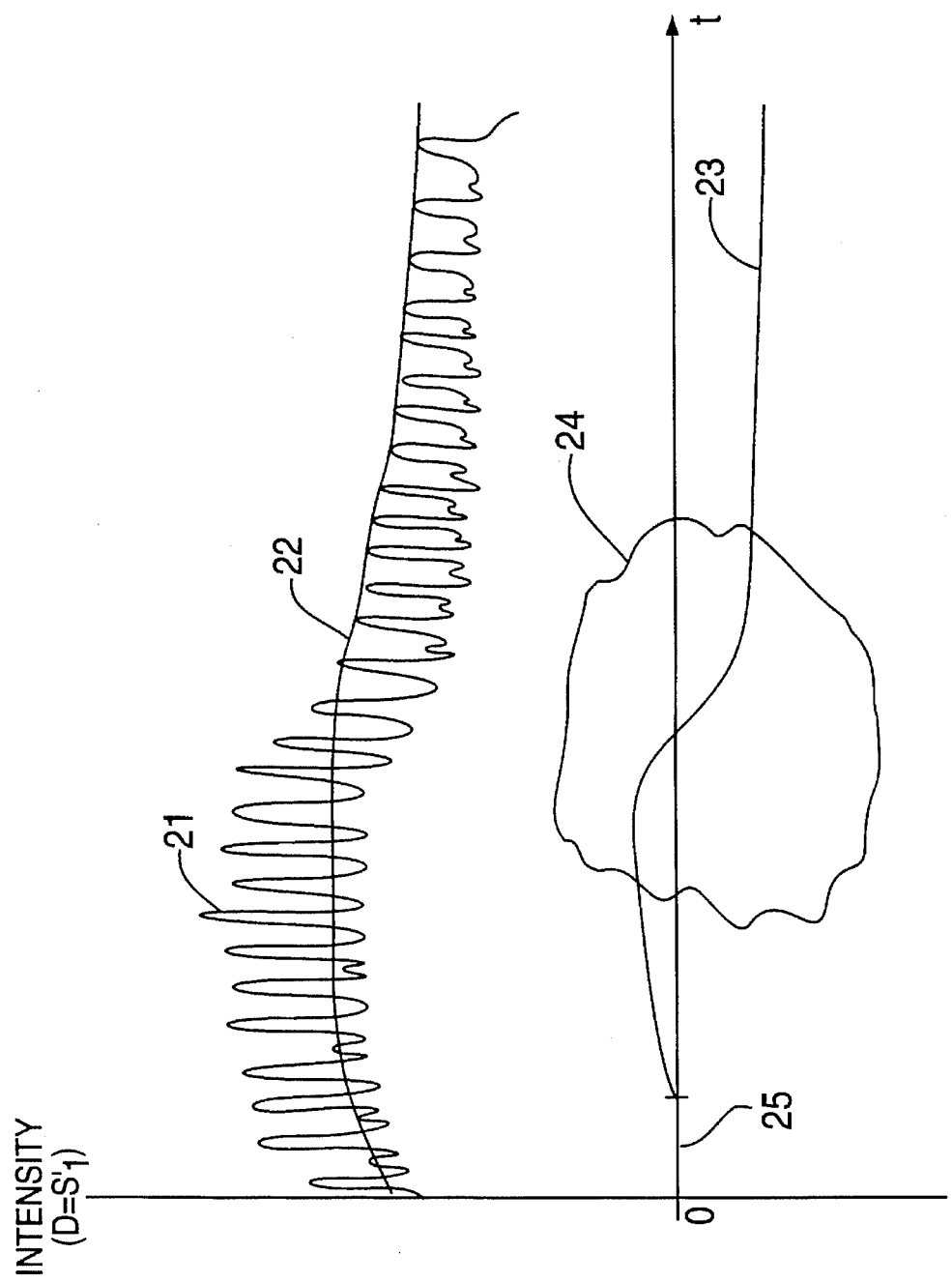
FIG. 2 illustrates a typical waveform representative of the time variation in the intensity of visible light as emitted from the plasma chamber of FIG. 1, along with signals related to the intensity.

With reference to FIG. 2, there is shown a waveform 21 depicting, for example, the narrow-band analog signal S1 (S2 or S3 also has a similar depiction). To present the most fundamental aspects of the present invention, the case wherein the signal D is related only to S1/S1' is covered first; thus the waveform 21 determines the signal D for this case. The waveform 21 is representative of the continuous time variation in the intensity of the optical wavelength L1 as emitted by the plasma 105 contained within the plasma chamber 104, and this waveform inherently possesses the information needed to determine when to terminate a particular etch step. The exemplary waveform 21 is then processed, as now described, to determine those time points at which significant process events occur. Examples of such events in a TiN process include the time at which the interface between the tungsten layer and the titanium nitride adhesion layer is reached, or when the interface between the adhesion layer and the underlying oxide is reached. Two other waveforms related to the waveform 21 are generated.

A waveform 22 is a "smoothed" version of the waveform 21, and is produced by passing the signal S1 through a low-pass electronic filter. A waveform 23 is a resultant signal obtained by subtracting the "smoothed" signal shown by the waveform 22 from the waveform 21, and then "smoothing" the resultant signal with a low-pass electronic filter; the waveform 23 defines the signal S1'. Moreover, for the particular case being exemplified, the decision signal D is set equal to S1', that is, D=S1'. (Oftentimes when processing the resultant signal depicted by the waveform 23, the initial portion of the resultant signal, as shown by the time interval 25 in FIG. 2, is ignored because the resultant signal in this interval includes transient, start-up effects which are not relevant to the endpoint detection process.) The characteristics of the waveform 23 within a region 24 provide information pertinent to the endpoint detection process; to explain how the signal changes occurring within the region 24 can yield endpoint control information, FIG. 3 presents an enlarged version of the region 24 to more readily visualize the procedure for extracting this control information.

Figure 3:
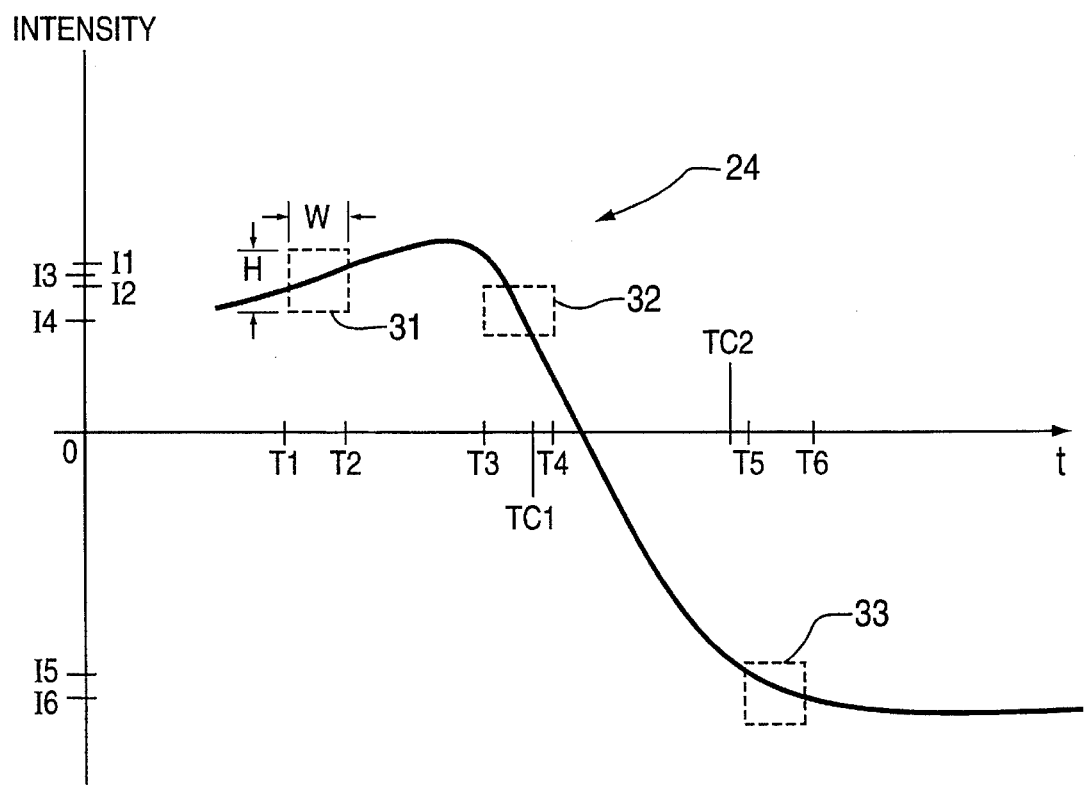
FIG. 3 depicts, in exploded view, a region of the averaged signal shown in FIG. 2 to illustrate the procedure for determining an endpoint condition for the etch step.

Thus, with reference to FIG. 3, a so-called "reference-slope" box is defined by a vertical side having a fixed intensity difference H and a horizontal side having a fixed time difference W; three snapshots of the box as it is moved in time across the waveform 23 are shown as boxes 31, 32 and 33. The reference slope is H/W. The box 31 has its horizontal side ranging from the time T1 to the time T2—T2 is selected as a time point for which a comparison between the magnitude of the slope of the waveform 23 and the reference-slope is desired, and then T1 is computed as T2-W. At T2, the intensity value of the waveform 23 is denoted I2, whereas at T1 the value is I1. Given I1, I2, T1, and T2, an estimate of the signal slope of the waveform 23 at time T2 is computed as (I2-I1)/(T2-T1). As depicted, the magnitude of the signal slope is less than the reference slope [|(I2-I1)/(T2-T1)|<H/W].

The reference-slope box moves across the region 24 in real-time. The next snapshot of the moving reference-slope box is depicted by the box 32 encompassing the time interval T4-T3. At time T3, the intensity is I3, whereas at T4 the intensity is I4. Thus, the signal slope for the box 32 is (I4-I3)/(T4-T3). For the T4 instant of time, the magnitude of the signal slope exceeds the reference slope [|(I4-I3)/(T4-T3)|>H/W].

The next snapshot of the moving reference-slope box is depicted by the box 33 encompassing the time interval T6-T5. At times T5 and T6 the intensities are I5 and I6, respectively. Thus, the signal slope for the box 33 is (I6-I5)/(T6-T5). For the T6 instant of time, the magnitude of the signal slope is less than the reference slope [|(I6-I5)/(T6-T5)|<H/W]. By comparing the slope computations associated with the snapshots for the box locations 31, 32 and 33, it is readily deduced that there exits a time TC1 between T2 and T4 and a time TC2 between T4 and T6 such that the magnitude of the signal slope equals the reference-slope. The transitions occurring proximate to times TC1 and TC2 track directly to rapidly changing physical characteristics of the plasma 105 as discerned from the changes in light intensity. In the case of etching TiN, TC1 is an estimate to the point in time at which the oxide beneath the titanium nitride is becoming exposed, whereas TC2 is an estimate to the point in time that the oxide is fully exposed. In one aspect of the present invention, one or the other of the time indicators may be used to signal the termination of the etch step.

Figure 4:
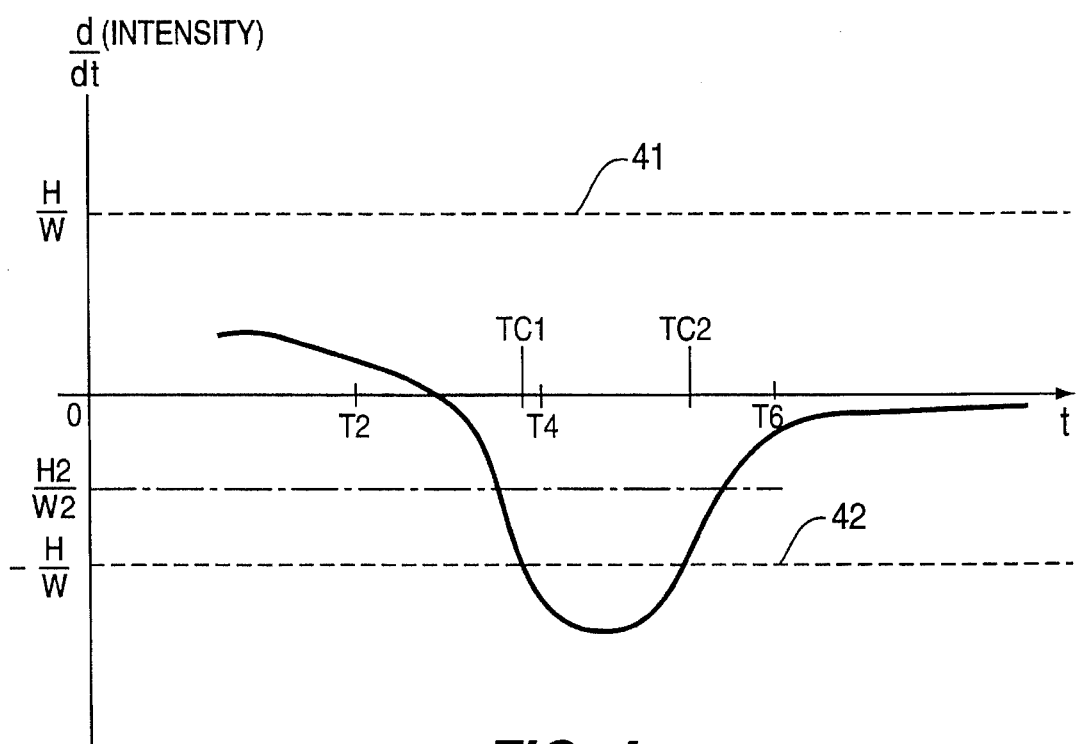
FIG. 4 depicts the derivative of the waveform of FIG. 4 with respect to time.

The signal slope characteristics just discussed as well as comparisons to the reference-slope are more easily interpreted by considering the derivative of the waveform 23 with respect to time, as shown in FIG. 4. In FIG. 4, both the positive and negative values of the reference slope H/W are marked on the Y-axis by the reference numerals 41 and 42, respectively; as a shorthand, the H/W constant value plotted on FIG. 4 may be called a "threshold" level, and values of the derivative waveform that exceed the threshold, in either the positive or negative sense, track to significant changes in the make-up of the plasma 105. Thus, in this case, the time interval for which the derivative has a magnitude exceeding H/W, namely the interval between TC1 and TC2, corresponds to the time period for which the plasma 105 is undergoing notable changes in its physical composition. TC1 and TC2 pinpoint such changes. It is also clear from FIG. 4 that a new threshold, say H2/W2, may be used to judge the same or other chemical changes taking place within the plasma 105. It has been empirically determined that a change such as the time at which exposure of the underlying oxide commences generally requires a different threshold than the time at which full exposure of the oxide occurs, particularly if different gases and, concomitantly, different optical wavelengths, are detected and processed.

What multiple thresholds imply with respect to the discussion of FIG. 3 is merely the introduction and use of a different reference-slope box having, e.g., height of H2 and width of W2, for tracking the trailing end of the waveform 23. Thus, in more generic terms, a reference-slope box providing a reference of H/W may be initially used to pinpoint a slope with a magnitude exceeding H/W, whereas another reference-slope box providing a reference slope of H2/W2 may then be used to locate a slope with a magnitude falling below H2/W2.

Figure 5:
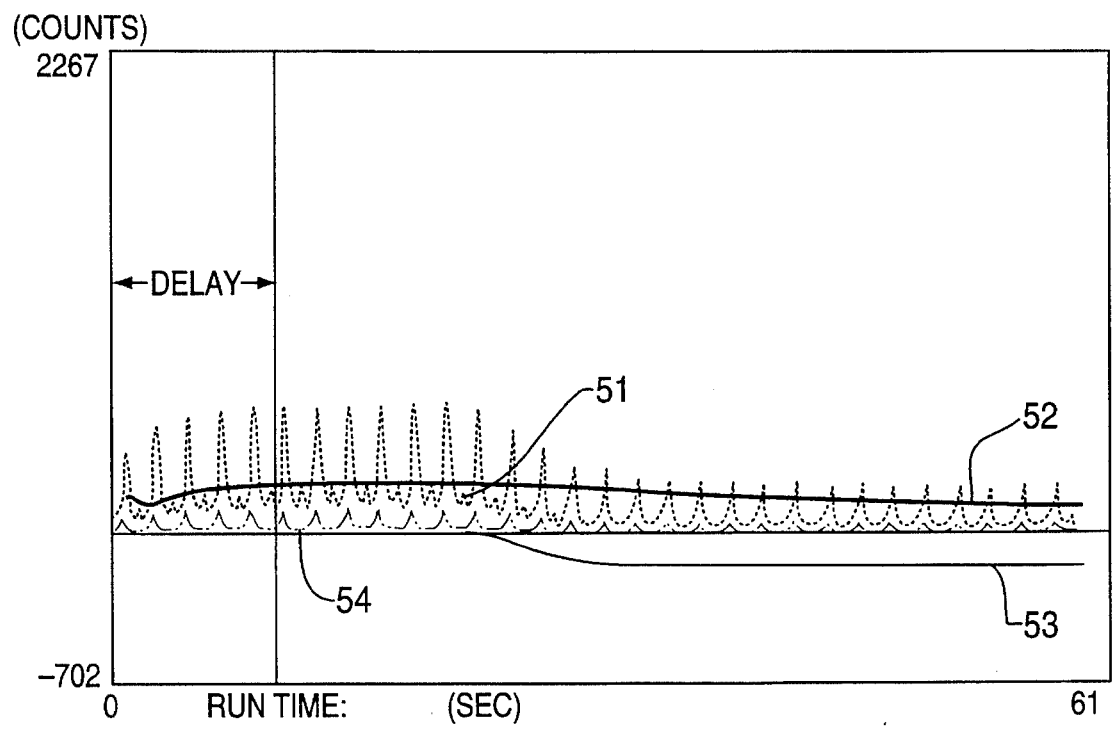
FIG. 5 illustrates the waveforms produced by the arrangement of FIG. 1 in which the bandpass filter centered at a first wavelength is selected for detecting one of the elements of the materials being etched without endpoint limits provided.

Referring now to FIG. 5, the waveforms 51, 52, and 53 correspond to the waveforms 21, 22, and 23 of FIG. 2, respectively (the waveform 54 is merely the waveform 51 before an amplification factor is applied, and is shown for completeness since the later discussion points out that the user 131 can set an amplification factor to convert the "raw" waveform 54 to the amplified waveform 51). The vertical, or Y-axis of FIG. 5, is displayed in "counts" (the intensity of the signals S1', S2' or S3' is normally detected and measured in volts, but a mapping of volts-to-counts is most convenient for the signal processing effected by the signal processor 112 when the processor 112 is implemented digitally in a preferred embodiment—in such a preferred illustrative embodiment, one volt translates to approximately 450 counts). The waveforms 51, 52, and 53 result from the detection, via a 380 nm bandpass filter, of the emissions in a plasma 105 used for etching of TiN in a chlorine-argon plasma. This filter is used typically for detecting endpoint by monitoring nitrogen emissions in the plasma 105. The intensity differential for endpoint detection is approximately minus 150 counts, that is, the long-term intensity shown by the waveform 53 asymptotically approaches about −150 counts. FIG. 5 is shown as a benchmark for the purposes of discussing FIGS. 6–8. As now discussed, FIGS. 6 and 7, as well as FIG. 8, each basically replicate FIG. 5, but FIGS. 6 and 7 have so-called markers which are automatically generated by the signal processor 112 to indicate when endpoint conditions are met, and as an ancillary outcome, to provide a visual display to the user 131 informing the user 131 of the endpoint times.

Figure 6:
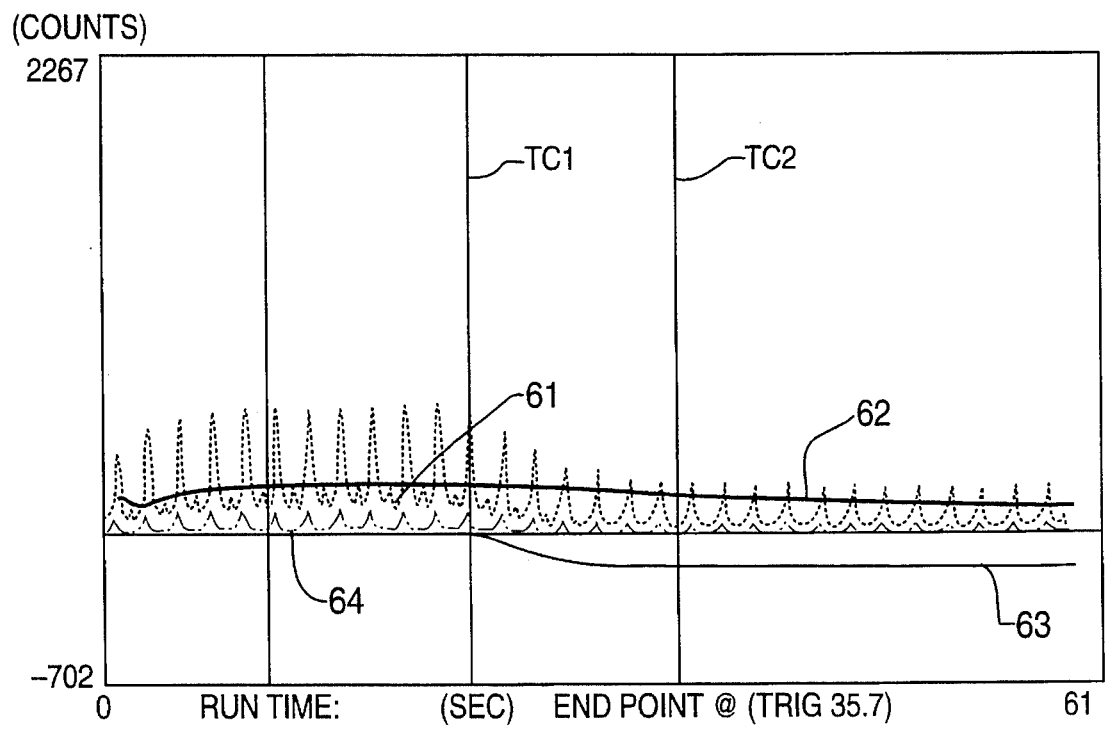
FIG. 6 depicts the waveforms of FIG. 5 including endpoint limits.
Figure 7:
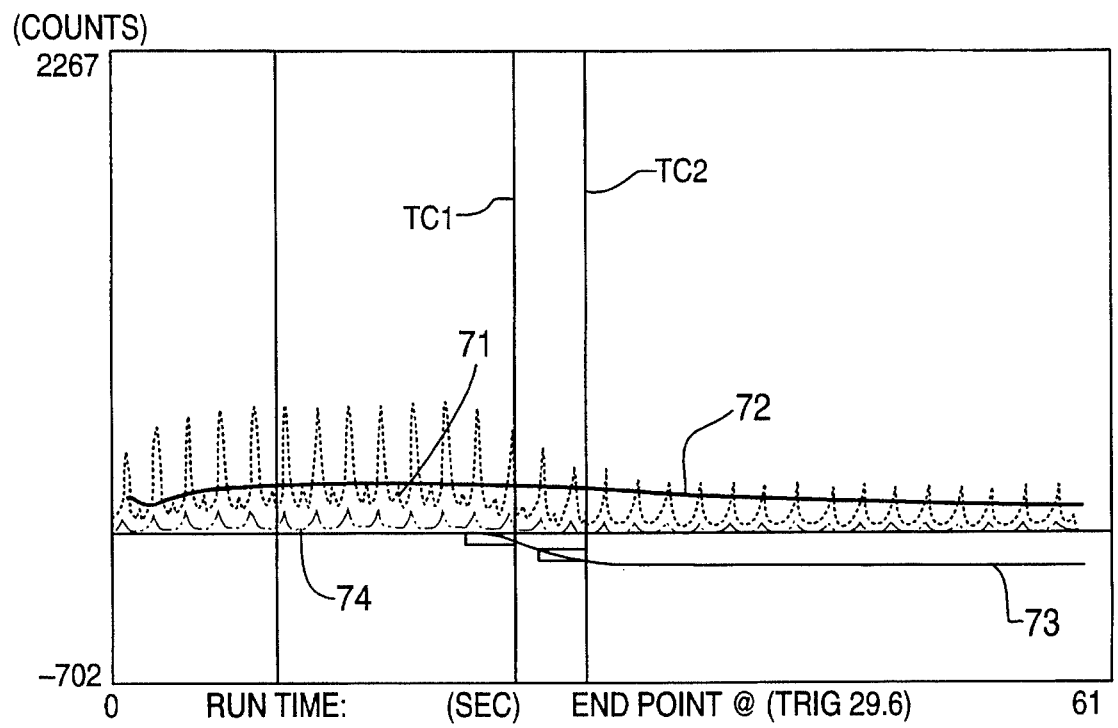
FIG. 7 illustrates the waveforms of FIG. 6 with endpoint set for greater resolution.
Figure 8:
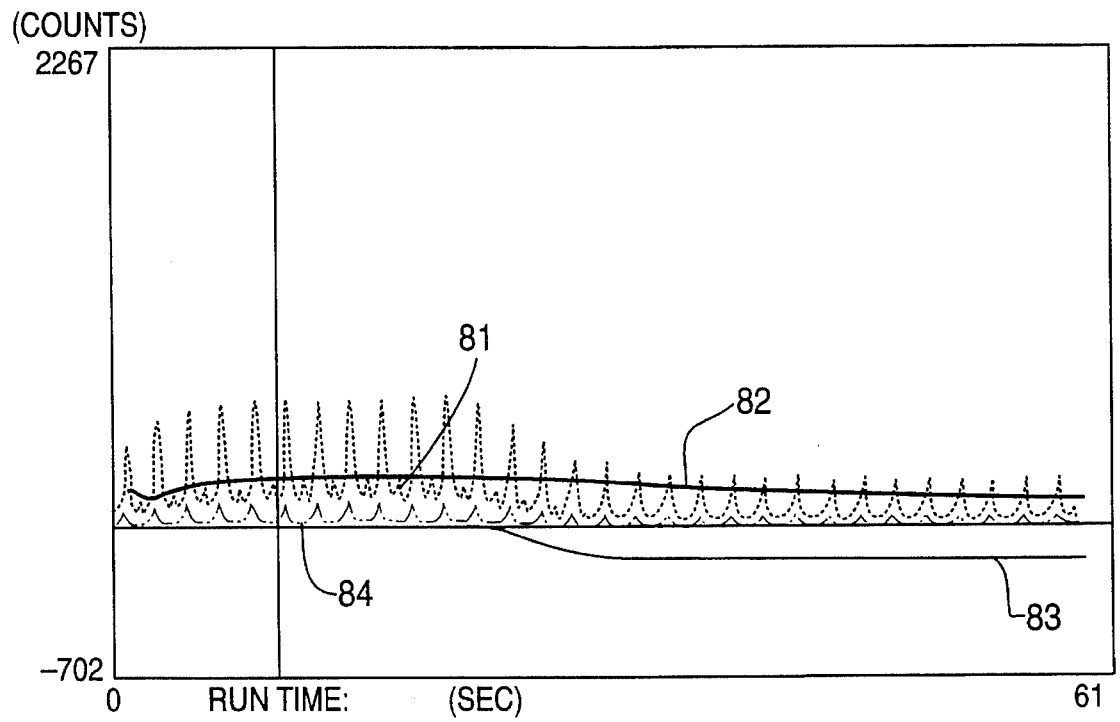
FIG. 8 illustrates the waveforms of FIG. 7 with endpoint set for even greater resolution.

Referring now to FIGS. 6, 7 and 8, the waveforms 61, 71 and 81 correspond respectively to the waveform 51 of FIG. 5. Similarly, the waveforms 62, 72 and 82 correspond to the waveform 52; the waveforms 63, 73 and 83 correspond to the waveform 53; and the waveforms 64, 74 and 84 correspond respectively to the waveform 54. In FIGS. 6 and 7, endpoint set-up markers labeled TC1 and TC2 are shown.

For purposes of the present invention and in the context of the examples given, an endpoint condition is based upon empirically-derived data which requires a change of at least H counts in W seconds (e.g., in the FIGS. 6, 7 and 8, H=10, 50 and 100, respectively, and W=3 seconds). It is important to note that, if the endpoint reference-slope box is too small in either dimension, an unwanted endpoint may be detected by a spurious fluctuation in the waveform undergoing processing.

Referring now to FIG. 6, with the reference-slope box defined by H=10 counts and W=3 seconds, an endpoint indicator corresponding to the vertical marker labeled TC2 appears at 35.7 seconds; a listing of this time point is also provided below the X axis. (This is an appropriate juncture to note that FIG. 6 is a pictorial representation of an actual display of real process data as displayed on a monitor forming part of the signal processor 112; such a display serves to further teach one skilled in the art about the generalities as well as nuances of real process data and techniques for displaying such data in real-time). FIG. 6 also shows another vertical marker labeled TC1. In this particular example, the user 131 has decided to use TC2 as the indicator to end the etch step; accordingly, the etch process is not stopped at TC1, that is, upon initial exposure of the underlying oxide layer, but rather at time TC2 associated with the complete removal of all TiN.

To demonstrate how detecting changes in the intensity of the waveform 53 in FIG. 5 is sensitive to the selection of H and W, reference is now made to waveform 73 in FIG. 7. For the detection process, H=50 counts and W=3 seconds, yielding a TC2 marker which occurs at 29.6 seconds.

Finally, referring to FIG. 8, when H=100 counts and W=3 seconds, no endpoint is detected, that is, no time marker equivalent to TC1 or TC2 of the FIGS. 6 or 7 could be located since the incremental changes in intensity were too small for the defined endpoint conditions. As shown, the waveform 83 only changes by about 150 counts over about 10 seconds, with no changes of 100 counts occurring in any 3-second time segment.

Figure 9:
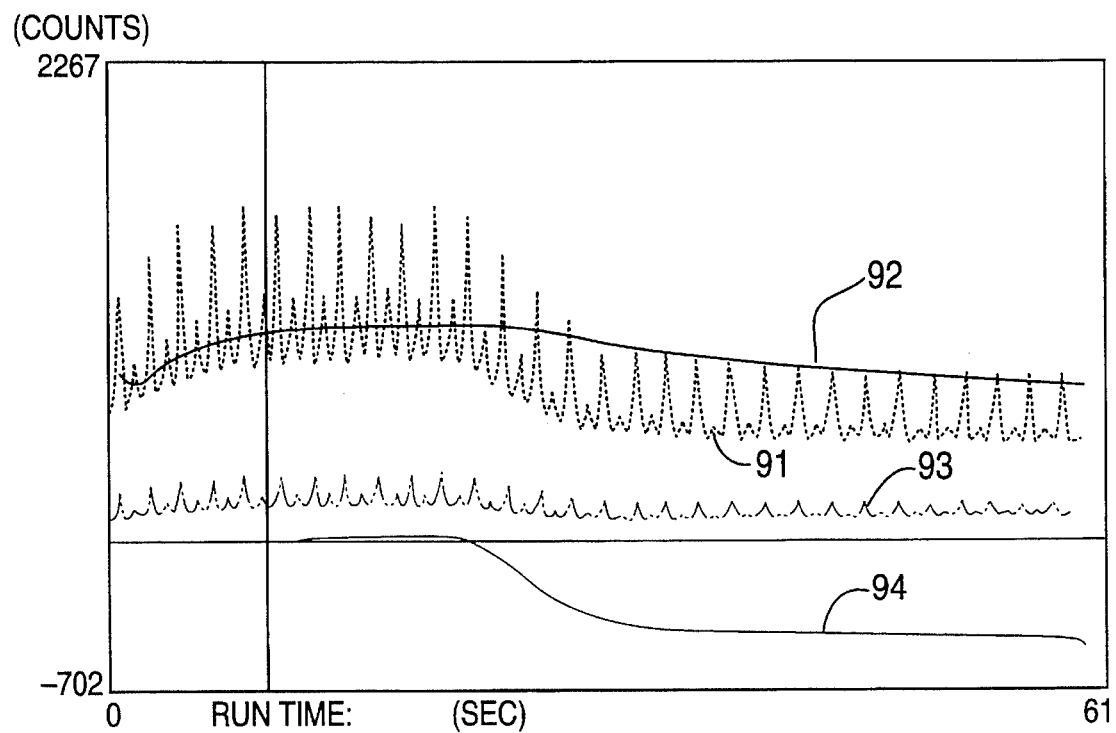
FIG. 9 illustrates the waveforms produced by the arrangement of the present invention in which a second bandpass filter centered at a second wavelength is selected for detecting the same elements discussed with reference to FIGS. 5–8, without endpoint limits provided.

With reference now to FIG. 9, once again the waveforms 91, 92 93 and 94 correspond to the waveforms 51, 52, 53 and 54, respectively. However, FIG. 9, which is purposely shown devoid of endpoint markers for reference purposes, illustrates waveforms derived by the endpoint detection system 110 utilizing a 700 nm bandpass filter. It is immediately apparent that the waveform 93 asymptotically approaches approximately −450 counts as contrasted to −150 counts for FIG. 5 which shows for example waveform 53 generated by using a 380 nm filter, as we saw above. The results shown in FIG. 9 are for the same plasma conditions for which the waveforms of FIG. 5 are shown; thus, for the same etching materials used to etch the same semiconductor wafer material, data having potentially better resolution for detecting process step endpoint is obtained by monitoring plasma element emissions at a wavelength of 700 nm. Such emissions may be from the same or different elements in the plasma which may be produced by the etching materials or by materials from the wafer being etched.

Figure 10:
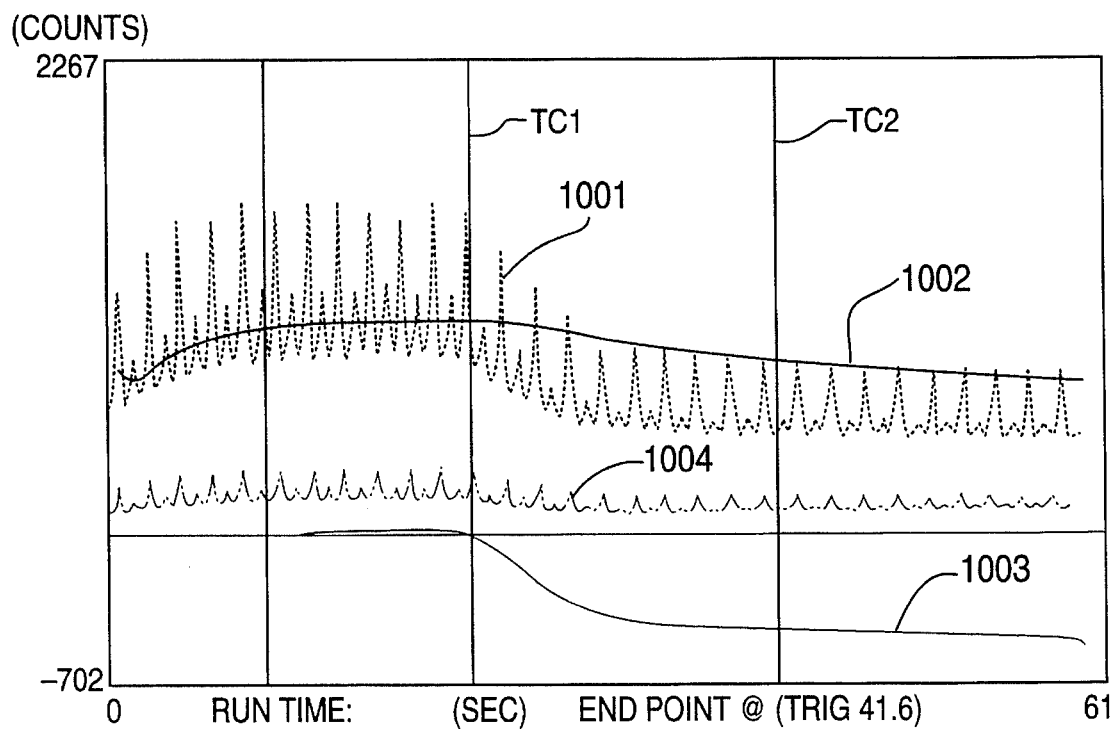
FIG. 10 depicts the waveforms of FIG. 9 including endpoint limits.
Figure 11:
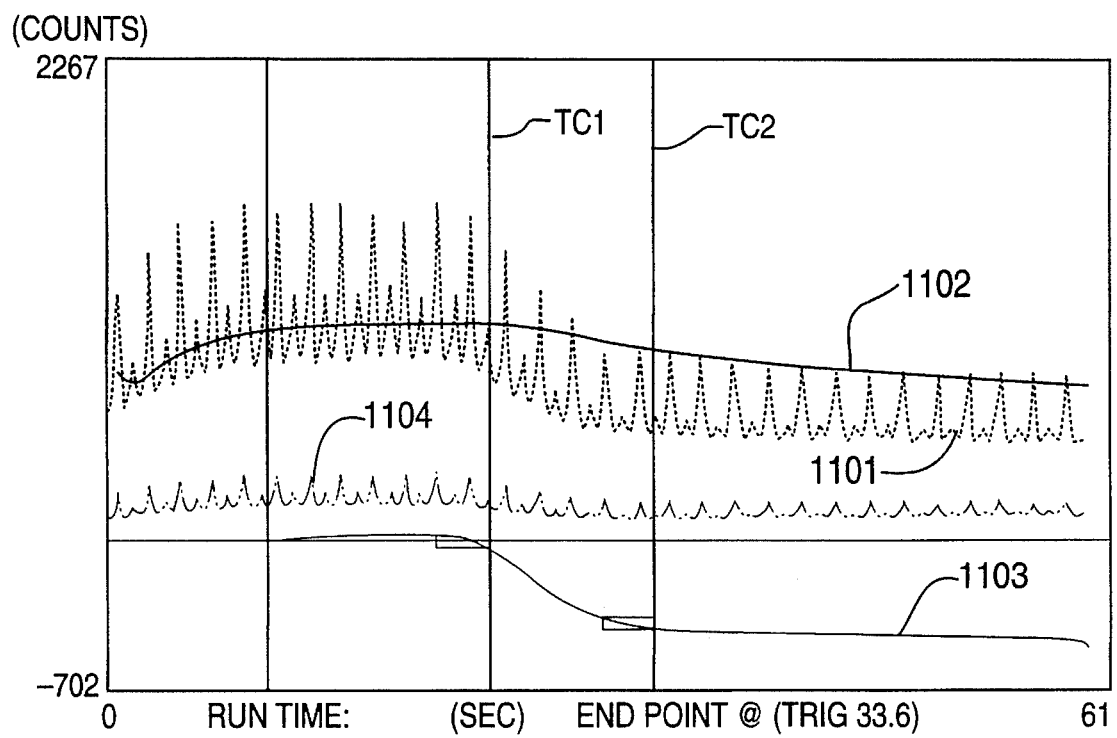
FIG. 11 illustrates the waveforms of FIG. 10 with endpoint set for greater resolution.
Figure 12:
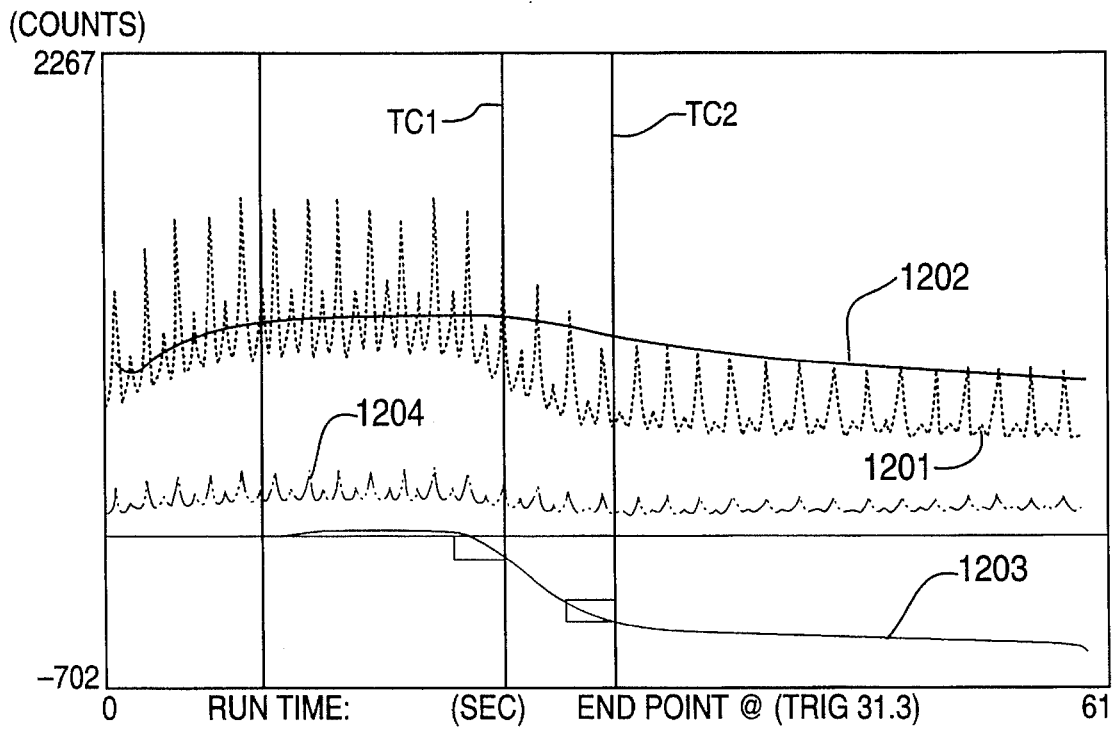
FIG. 12 illustrates the waveforms of FIG. 11 with endpoint set for even greater resolution.

To demonstrate that it is indeed the case that better resolution is obtained from the intensity waveform set forth in FIG. 5, reference is now made to FIGS. 10, 11 and 12 wherein the waveforms 1001, 1101 and 1201 correspond to the waveform 91 of FIG. 9. Similarly, the waveforms 1002, 1102 and 1202 correspond to the waveform 92; the waveforms 1003, 1103 and 1203 correspond to the waveform 93; and the waveforms 1004, 1104 and 1204 correspond to the waveform 94 of FIG. 9. As in FIGS. 6 and 7, the endpoint markers TC1 and TC2 as determined by the detection process in the processor 112 are displayed in FIGS. 10, 11 and 12. In FIGS. 10–12, H=10, 50 and 100 counts, respectively, with W=3 seconds for each case.

Below is given a summary of the data shown by the waveforms of FIGS. 10, 11 and 12.

TABLE I

| | ENDPOINT TIMES FOR 700 NM FIILTER | |
|---|---|---|
| FIG. | REFERENCE SLOPE H VALUE IN COUNTS | ENDPOINT TIME SECS |
| 10 | 10 | 41.6 |
| 11 | 50 | 33.6 |
| 12 | 100 | 31.3 |

These results are extremely desirable when compared with the results using a 380 nm bandpass filter for detecting elements of the materials being etched. Table II summarizes the data shown by the waveforms of FIGS. 6, 7 and 8. As described above, no endpoint was detected using the 380 nm filter for the etching step of interest when 100 counts in 3 seconds was the endpoint condition.

TABLE II

| | ENDPOINT TIMES FOR 380 NM FILTER | |
|---|---|---|
| FIG. | REFERENCE SLOPE H VALUE IN COUNTS | ENDPOINT TIME SECS |
| 10 | 10 | 35.7 |
| 11 | 50 | 29.6 |
| 12 | 100 | None |

To reiterate, by detecting the change in intensity of elements in the plasma 105 at a different wavelength than is taught or suggested by the prior art, greater accuracy and resolution for endpoint detection is produced.

To recap, the larger change in intensity at the 700 nm wavelength allows for a reference-slope box which has a larger H value than for the intensity signal measured at the conventional 380 nm wavelength. Accordingly, a premature shutdown of the etching step due to spurious fluctuations may be precluded with a larger H/W ratio.

Even better results are provided when changes in the emissions from elements in the plasma at two wavelengths are combined into a single waveform for use in indicating the endpoint of a process step. Simultaneous changes in emissions from the plasma at two or more wavelengths may be produced by the same element or different elements, and the elements may be produced by the etching materials or by materials from the wafer being etched.

It is preferred that the filters be of a limited bandwidth generally centered about the main wavelengths of interest; specifically, it is preferable that the bandwidth of each filter be about plus or minus 20 nm in the foregoing application. Other applications may require filters of narrower or somewhat greater bandwidth. Signal strength is enhanced, the risk of a false endpoint determination is lessened, and the accuracy of endpoint determination is further improved. For example, by specifying that the 700 nm filter have a bandwidth of plus or minus 20 nm, not only is fluorine at 704 nm detected, but also nitrogen emissions at 688 and 693 nm; all of which can be useful in calculating the endpoints for tungsten and TiN etching in accordance with the methods of the invention.

Figure 13:
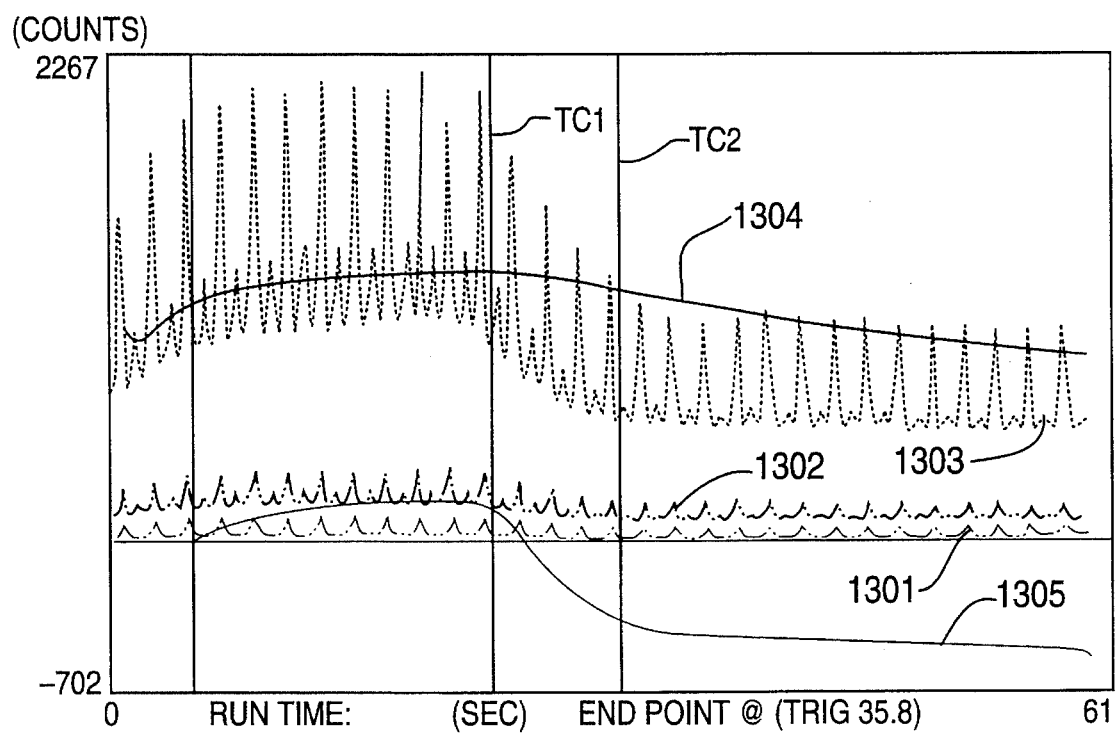
FIG. 13 illustrates waveforms resulting from the combination of waveforms in FIGS. 8 and 12.

Referring now to FIG. 13, the waveform 1301 represents the electromagnetic emissions from an element of the material being etched, such as nitrogen in a process where TiN is etched. In like manner, the waveform 1302 can represent the electromagnetic emission of the same element at a different wavelength. The waveform 1303 is the amplified combination of the waveforms 1301 and 1302, and the waveform 1304 is the running average, that is, a smoothed version of the waveform 1303. The waveform 1305 is the resultant signal formed by filtering the remainder waveform determined by subtracting the waveform 1304 from the waveform 1303; the waveform 1305 provides a total count differential asymptotically approaching approximately 550 counts, resulting in an even greater resolution for more precise process step endpoint determination. If the endpoint criteria is 100 counts in 3 seconds, then TC1=24.4 seconds and TC2=35.8 seconds, and the etch step is terminated at time TC2 as selected by the user 131.

Figure 14:
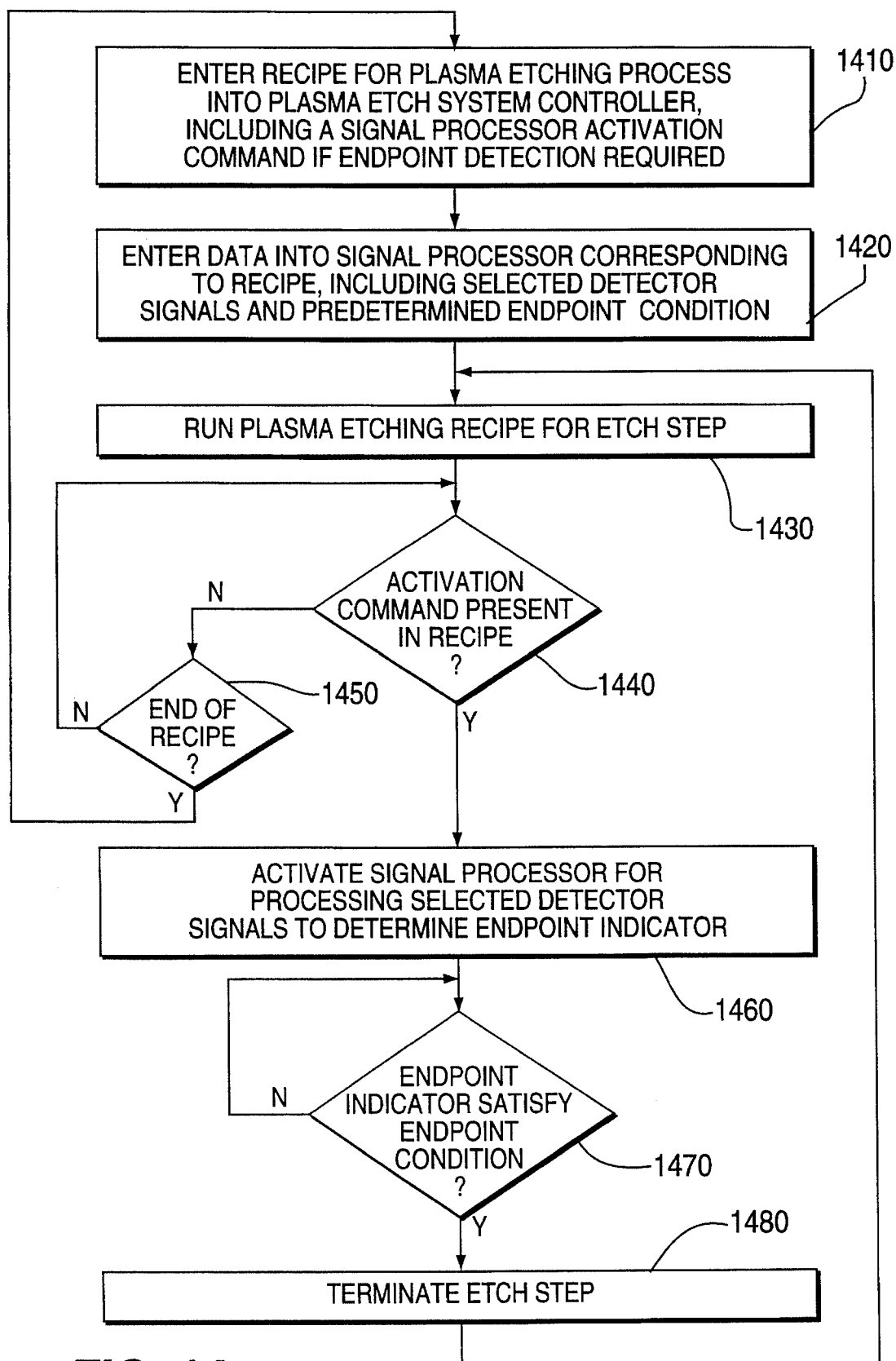
FIG. 14 is a high-level flow diagram depicting the method effected by the plasma etching arrangement, including the endpoint detection system, of FIG. 1.

The process flow diagram set forth in FIG. 14 provides a high-level description of the steps to carry out the methodology of the present invention, and serves to summarize the operation of endpoint detection system 110 of FIG. 1. With reference to FIG. 14, processing block 1410 depicts the starting point for each particular etch process as initiated by user 131 entering the desired etch recipe into plasma etching system controller 103; the etch recipe includes a signal processor activation command if endpoint detection is required for a step in the etch process. In addition, as indicated by block 1420, user 131 also enters data into signal processor 112 which corresponds to the etch recipe, including selected detector signals to be processed (e.g., S1', S2', S3', or some combination of these signals) as well as a predetermined endpoint condition (e.g., as defined by the reference-slope box described with reference to FIG. 3). Once controller 103 and processor 112 are appropriately initialized, plasma controller 103 is activated by user 131 to begin the running of the plasma etch recipe; this step is depicted by block 1430. Next, as indicated by processing block 1440, if the recipe includes an activation command, such a command is transmitted to signal processor 112 so it may commence processing the selected ones of the detector signals to determine an endpoint indicator (e.g., signal D). At each particular etch step, as invoked by decision block 1450, if a signal activation command is not present, processor block 1440 is re-entered provided that more steps remain in the recipe. Processing depicted by decision block 1470 follows the processing depicted by block 1460, namely, the endpoint indicator is tested to determine if the specified endpoint condition is reached (e.g. the reference slope comparison technique locates TC1). If the condition is satisfied, processing by block 1480 is invoked to terminate the particular etch step; if the condition is not yet achieved, the endpoint indicator is re-tested at a new time point to now determine if the endpoint condition is met.

Processing by block 1460 is preferably carried out by a digital computer program stored in the signal processor means 112. Such a digital computer program performs the signal processing discussed with respect to FIGS. 2–13, namely: smoothing of the analog signals S1–S3; subtraction of the smoothed versions of S1–S3 from S1–S3, respectively, to obtain S1'–S3'; and evaluation of the change in intensity of S1'–S3' using the reference-slope box technique. These processing steps can be carried out using standard digital signal processing procedures such as a Finite Impulse Response (FIR) technique to effect smoothing (FIR low pass filter) and to evaluate intensity changes (FIR derivative filter).

PREFERRED EMBODIMENT OF THE PRESENT INVENTION

The plasma system 101 comprises, illustratively, a Precision 5000 BWCVD system produced by Applied Materials, Santa Clara, Calif. The plasma system 101 forms no part of the present invention; rather, my invention serves as an adjunct to the plasma system 101 to effect automatic control of the plasma system 101.

Figure 15:
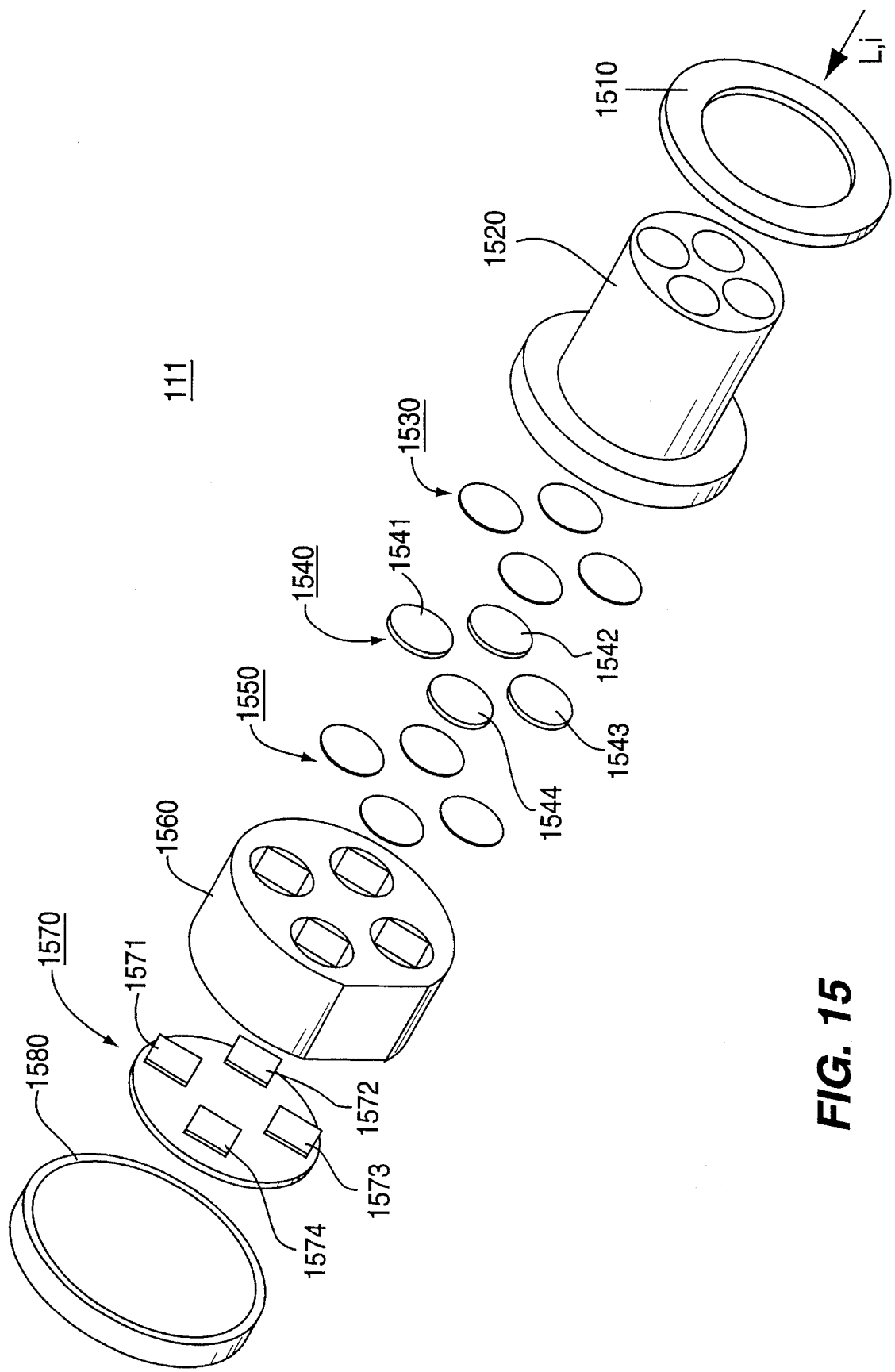
FIG. 15 illustrates an implementation of detector 111 of FIG. 1.

The detector 111 may be multi-emission endpoint assembly produced by Applied Materials, including part Nos. 0240-10133, 0090-09029, and 0100-09154. The arrangement of these parts is shown in exploded view in FIG. 15 so as to provide an essentially self-contained description of detector apparatus within this detailed description. With reference to FIG. 15, the detector 111 is composed of: a viewport clamp 1510; housing 1520; O-rings 1530 and 1550 to provide mechanical support; an optical filter assembly 1540; a body 1560; and a photodetector assembly 1570. The filter assembly 1540 in accordance with this illustrative embodiment is further composed of: a 380 nm filter lens 1541, a 700 nm filter lens 1542, a 340 nm filter lens 1543, each having a limited bandpass generally centered about the particular respective wavelength; and a filter lens 1544 which is "neutral" (i.e., all-pass) in the commercially available endpoint assembly but may be retrofitted with a bandpass filter to update the assembly if needed. The photodetector assembly 1570 is further composed of four essentially identical photo sensing devices 1571–1574 each comprising an electronic photo diode sensor well-known in the art. The photo sensing device 1571 detects the optical signal emanating from the lens 1541 and converts this optical energy to an electrical analog signal indicative of the intensity of light emissions having energy centered around the bandpass corresponding to 380 nm. The photo sensing devices 1572–1574 provide the same conversion function as the device 1571 for each corresponding bandpass.

The signal processor 112 may include a typical personal computer such as a model PS2 produced by IBM Corporation, or equivalent, and is generally composed of conventional components such as central processor, storage for storing programs, a keyboard, and a display device such as a monitor. The signal processor 112 also includes an etchback application program loaded into storage for carrying out the processing set forth in FIG. 14 and described in detail with respect to FIGS. 2–13. The signal processor 112 is also configured with a conventional interface board (not shown) to produce digitized signals from analog input signals. The signal processor 112 receives these digitized versions of the analog signals detected by the photo sensing devices 1571–1574 as four separate inputs which are then available for independent processing or for combining whenever this option is selected by the user 131.

Endpoint Detector Software Screens

Figures 16, 17:
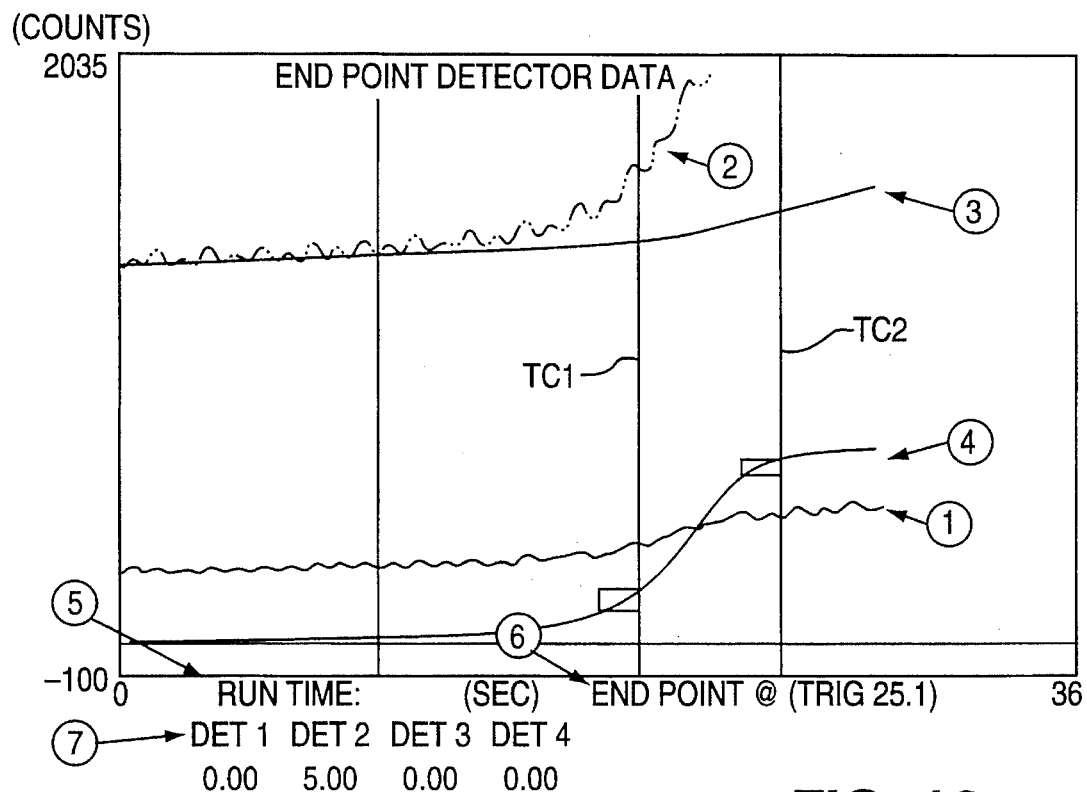
FIG. 16 illustrates a pertinent portion of an endpoint detector data screen for use with the endpoint detector system of the present invention.
FIG. 17 illustrates a pertinent portion of an endpoint parameter data screen for use with the endpoint detector system to the present invention.

The endpoint detector program loaded into the processor 112 provides two screens for viewing by the user 131 on the monitor of the processor 112, namely, the Endpoint Detector Data screen, shown in pertinent part by FIG. 16, and the Endpoint Parameter screen, shown in pertinent part by FIG. 17. The Endpoint Detector Data screen displays the actual endpoint detection data as it is being monitored by the detector 111 and processed by the processor 112. The Endpoint Parameter screen displays the parameters entered by the user 131 which are then used by the detection program to detect the endpoint condition.

The pertinent software parameters which are deployed by the processing software described by the flow diagram form in FIG. 14 or data input or output relative to aspects of my invention which operate under control of the parameters and information on the Data and Parameter screens are now listed and explained in Table III and Table IV, respectively. The "Function #" in the following two tables refers to the corresponding circled numbers in FIGS. 16 and 17.

TABLE III

ENDPOINT DETECTOR DATA SCREEN FUNCTIONS

| Function # and Name | Function Definition and Input Parameters |
|---|---|
| 1. Raw Signal | This is the raw output from photo sensing devices 1571–1574 (mV). |
| 2. Amplified Signal | This is the amplified raw signal. Amplification is employed when the raw signal by itself is weak and difficult to detect. |
| 3. Background Signal | This is the amplified signal after it has been averaged. (Also called the "smoothed signal" or "running average".) Processor 112 constantly |

TABLE III-continued

ENDPOINT DETECTOR DATA SCREEN FUNCTIONS

| Function # and Name | Function Definition and Input Parameters |
|---|---|
| | monitors the signal and calculates the average of the digitized data measured so that a smooth signal can be obtained. |
| 4. Resultant Signal | This is the result of smoothing the background signal subtracted from the amplified signal. |
| 5. RunTime | This field displays the elapsed time in seconds of the etch step requiring endpoint detection. |
| 6. End-Point @ [Trig.] | This field displays the time from the start of the etch step to the time endpoint was detected. |
| 7. Endpoint Signal & Amplification Factor | This line displays the choice of signals that can be monitored and their amplification factors. The signal to be monitored and the amplification factors are selected using the "Trigger Coeff's" field of the Endpoint Parameters screen. |

TABLE IV

ENDPOINT PARAMETER SCREEN FUNCTIONS

| Function # and Name | Input Parameters |
|---|---|
| 1. Recipes | This line shows the number and types of endpoint recipes available. The recipe names are programmable and 3 different recipes are exemplified |
| 2. Trigger Coeff's | The four user-programmable entry fields correspond to four photo sensing devices 1571–1574 that can be monitored to detect endpoint. Bandpass filter #1, i.e., Det1, (lens 1541) monitors a wavelength of 380 nm, which corresponds to nitrogen. Nitrogen is released when etching through a TiN adhesion layer, so this bandpass filter is selected when the etchback process is designed to remove the TiN adhesion layer along with the tungsten film. Bandpass filter #2, i.e., Det2, (1542) monitors a wavelength of 704 nm, which corresponds to fluorine. SF6 is used to etch tungsten, so this bandpass filter is selected when the etchback process is designed to etch the blanket tungsten only and leave the TiN adhesion layer in place. Bandpass filter #3, i.e., Det3, (lens 1543) monitors a wavelength of 340 nm, which corresponds to chlorine compounds. Chlorinated chemistries are used to etch TiW, so this bandpass filter is selected when etching a wafer with a TiW adhesion layer. There is no bandpass filter in location #4 i.e., Det4, (usually called "Neutral"), so selecting this option will allow processor 112 access to all of the wavelengths present in the plasma. |
| 3. Amplification Factor | The endpoint signal being monitored is usually amplified to make it easier to track. Each recipe has a field where user 131 can enter the desired amplification factor for the signal being monitered. Standard input parameters are from –2 to 2. |
| 4. Initial Delay | "Initial Delay" refers to the time between the beginning of the etch process and the beginning of endpoint tracking as described with respect to FIG. 2. At the beginning of an etch cycle, there are always pressure variations, RF fluctuations, or fluctuations in the plasma intensity. This makes the signal being monitored unstable and unsuitable for endpoint detection. The "Initial Delay" function delays the beginning of endpoint tracking until the plasma has stabilized and a steady signal can be obtained. The delay can be set from 0–999 seconds. |
| 5. Time Out | This function terminates the etch process after a certain time if endpoint is not found. The time can be set from 0–999 seconds. |
| 6. Width | Processor 112 detects endpoint using the |
| (W)/ Height (H) | reference-slope box defined by W and H. Two endpoint detection boxes are displayed on the monitor of processor 112. The width of the box defines the period of time during which endpoint is to be detected, and the height of the box defines the intensity range of the signal. The signal trace will pass through the box and endpoint is detected when the slope of the signal trace exceeds the height of the box within the time defined by the width of the box. The width of the box can be set from 0–99 seconds, and the height can be set from –999 to 999. Depending on the etch process, the endpoint signalbeing monitored will rise or fall as it approaches endpoint. If endpoint is being detected when thesignal intensity increases, user 131 enters "I" (forIncrease) after the number that defines the box. When I is selected the system will detect endpoint when the signal slope equals or exceeds the height of the box divided by its width. If endpoint is being detected when the signal intensity decreases, user 131enters "D" (for Decrease) after the number that defines the box height. When "D" is selected the system will detect endpoint when the signal slope is less than the height of the box divided by its width. |
| 7. Box selection | This feature selects either or both of the endpoint boxes. Entering "F" will activate the first box, entering "S" will activate the second box, and entering "B" will activate both boxes. If both boxes are selected, the etch process will continue until the signal trace satisfies the parameters defined by the second box. This feature allows user 131 to program the system to detect two different endpoints within a single process step, such as the point of transition from bulk tungsten etch to residual tungsten etch, and the end of the residual tungsten etch. |
| 8. Overetch | Overetch begins after endpoint has been detected. This feature selects the extent of the overetch. The extent of the overetch can be defined as time in seconds or as a percentage of the total etch time. |

The present invention has been particularly shown and described with respect to certain preferred embodiments of features thereof. However, it should be readily apparent to those of ordinary skill in the art that various changes and modifications in form anti detail may be made without departing from the spirit and scope of the invention as set forth in the appended claims. The invention illustratively disclosed herein may be practiced without any element which is not specifically disclosed herein.

I claim:

1. A plasma etching system for etching titanium nitride from a semiconductor wafer in a chlorine-argon plasma, comprising:

a plasma chamber for generating the chlorine-argon plasma in which electromagnetic emissions are generated;

a viewport into the chamber for viewing the electromagnetic emissions;

plasma control means responsive to an activation signal for initiating tracking of said etching process and to an endpoint indicator signal for terminating the etching process;

detector means, coupled to the viewport, for detecting the emissions from elements present in the chamber and for generating a detector signal representing the intensity of the emissions within a limited bandwidth centered on an optical wavelength of about 700 nm;

signal processor means coupled to the detector means and said control means and responsive to said activation signal for processing said limited bandwidth detector signal in response to the activation signal to generate an endpoint indicator signal which is a function of said detector signals and indication of the endpoint of said etching process, said endpoint indicator signal being coupled to said plasma control means, whereby said etching process is automatically terminated in response to said endpoint indicator signal.

2. A system according to claim 1 wherein said detector means has a wavelength filter having a bandwidth of 700±20 nm.

3. A system according to claim 1 wherein said detector means comprises two detectors, one having a bandwidth of 700±20 nm and the other having a bandwidth of 380±20 nm.

4. A system according to claim 1 wherein said signal processor means includes means for smoothing said detector signals to generate corresponding resultant signals and means for evaluating changes in intensity of said resultant signals.

* * * * *